United States Patent
Zheng

[11] Patent Number: 6,094,396
[45] Date of Patent: Jul. 25, 2000

[54] MEMORY ARRAY ARCHITECTURE FOR MULTI-DATA RATE OPERATION

[75] Inventor: Hua Zheng, Fremont, Calif.

[73] Assignee: Winbond Electronics Corporation, Taiwan

[21] Appl. No.: 09/195,269

[22] Filed: Nov. 18, 1998

[51] Int. Cl.[7] .................................................. G11C 8/00
[52] U.S. Cl. .................. 365/230.03; 365/189.04
[58] Field of Search ................. 365/230.03, 189.01, 365/207, 230.01, 189.04

[56] References Cited

U.S. PATENT DOCUMENTS

| | | | |
|---|---|---|---|
| 4,733,376 | 3/1988 | Ogawa | 365/221 |
| 5,617,555 | 4/1997 | Patel | 365/230.03 |
| 5,930,194 | 7/1999 | Yamagata et al. | 365/230.03 |
| 5,940,329 | 8/1999 | Seitsinger et al. | 365/189.05 |

*Primary Examiner*—David Nelms
*Assistant Examiner*—David Lam
*Attorney, Agent, or Firm*—Dinh & Associates

[57] ABSTRACT

A memory array architecture (which can be used to implement a memory device and other circuits having an embedded memory array) supports multi-data rate operation. The memory device includes at least one memory array and at least one sense amplifier arrays. Each memory array is partitioned into a number of substantially similar segments. Each segment is associated with at least one local I/O lines. Each local I/O line has a length that is a portion of a length of the memory array. By partitioning the memory array, the supporting circuitry (e.g., the sense amplifier array), and the local I/O lines into segments, access of multiple data bits can be achieved without having to incur a significant "die penalty."

28 Claims, 5 Drawing Sheets

MEMORY ARRAY ARCHITECTURE FOR MULTI-DATA RATE OPERATION

This application is related to U.S. patent application Ser. No. 09/195,743, entitled "METHOD AND CIRCUIT FOR ACCESSING DATA BITS IN A MEMORY ARRAY IN MULTI-DATA RATE OPERATION," and U.S. patent application Ser. No. 08/195,268, entitled "METHOD AND CIRCUIT FOR TRIGGERING COLUMN SELECT LINE FOR WRITE OPERATIONS," both are filed on the same day as the present application, assigned to the assignee of the present invention, and incorporated herein by reference.

BACKGROUND OF THE INVENTION

The present invention relates generally to memory devices, and more particularly to a memory array architecture for multi-data rate operation.

Memory devices are integral to a computer system, and to many electronic circuits. Constant improvements in the operating speed and computing power of a central processing unit (CPU) enables operation of an ever-greater variety of applications, many of which require faster and larger memories. Larger memories can be obtained by shrinking the geometry of the memory cells and data lines within memory devices. However, with regard to memory speed, the access time for a memory device is generally governed by certain limitations. More particularly, memory speed is, to a large extent, dictated by the charge and discharge rates of parasitic capacitance on memory data lines.

Conventionally, a memory access to retrieve a data bit is performed by: (1) activating a row control line (e.g., a row select line or a word line) for the data bit; (2) waiting for the charge that is stored in a memory cell corresponding to the data bit to generate a voltage on a sense line; (3) sensing the charged voltage on the sense line to determine the value of the data bit; (4) activating a column select line; and (5) providing the detected bit value to a data line. A memory access to write a data bit is performed by: (1) activating the row control line for the required memory location; (2) receiving a write command and the associated data bit; (3) activating the column select line; and (4) providing the data bit to the memory cell. Conventionally, the steps for a memory read or a memory write are performed in sequential order for each accessed data bit.

The processes described above typically define the access time of a memory device (i.e., to retrieve or to write a data bit). The access time determines the maximum data transfer rate to or from a memory device. Traditionally, improvement in the access time of a memory read is limited to the time it takes to charge the sense line. Incremental improvements can be made to decrease the charge time by reducing the geometry of the device, thereby reducing the parasitic effects.

Large improvement in the data retrieval rate can be achieved by performing a concurrent prefetch of two data bits from memory and providing the retrieved bits on two data lines. In this manner, the memory device operates in a double-data-rate (DDR) operation. Large improvement in the data write rate can be achieved in a similar manner by (serially) receiving two data bits, aligning the data bits, and performing a concurrent double write to memory.

Conventionally, a concurrent read or write of two data bits requires additional circuitry, such as more internal data lines and sense amplifiers. The additional circuitry, while increasing the data transfer rate, results in larger die area and increased circuit cost. The increased die area is essentially a "die penalty" for the ability to concurrently access two data bits.

SUMMARY OF THE INVENTION

The invention provides a memory array architecture that supports multi-data rate operation while incurring a minimal "die penalty." The invention achieves this by partitioning a memory array into segments. With two segments, the memory array supports double data rate (DDR) operation where two data bits can be concurrently read from, or written to the memory array. Each segment allows access to a data bit from a section of the memory array associated with that segment.

A specific embodiment of the invention provides a memory device that includes at least one memory array and at least one sense amplifier arrays. Each memory array is partitioned into a number of substantially similar segments. Each segment is associated with at least one local input/output (I/0) lines. Each local I/0 line has a length that is a portion of a length of the memory array. By partitioning the memory array, the supporting circuitry (e.g., the sense amplifier array), and the local I/O lines into segments, access of multiple data bits can be achieved with minimal additional die area.

Another specific embodiment of the invention provides a memory device that includes two or more memory array blocks. Each memory array block includes a number of memory memory arrays, and can further include one or more sense amplifier arrays. Each memory array is partitioned into L substantially similar segments. Each segment is associated with at least one local I/O lines. The local I/O line(s) for a particular segment has substantially equal lengths. The length of each local I/O line is approximately 1/L of the length of the memory array. Again, since the length of each local I/O line is approximately 1/L of the length of the memory array, concurrent access of L data bits can be achieved without incurring a significant die penalty.

The foregoing, together with other aspects of this invention, will become more apparent when referring to the following specification, claims, and accompanying drawings.

DESCRIPTION OF THE SPECIFIC EMBODIMENTS

Figure 1:
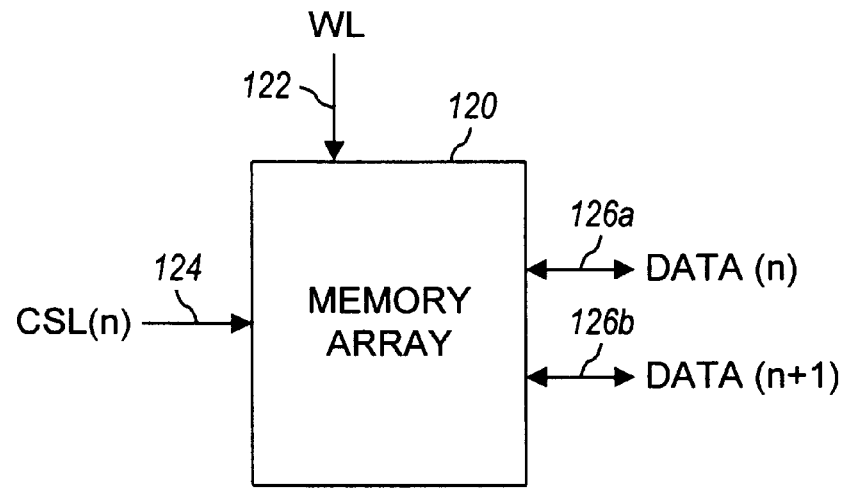
FIG. 1 shows a block diagram of a memory array that supports substantially concurrent access of two data bits from two different memory addresses.

FIG. 1 shows a block diagram of a memory array 120 that supports substantially concurrent access of two data bits from two different memory addresses for a double data rate (DDR) operation. Memory array 120 can be implemented within a dynamic random access memory (DRAM), a synchronous DRAM (SDRAM), a synchronous graphics RAM (SGRAM), or other types of memory devices. The data bits are accessed by activating a word line (WL) 122 corresponding to the selected row of memory array 120 and a column select line (CSL) 124 corresponding to the selected columns. As shown in FIG. 1, a common CSL 124 determines the memory addresses of both accessed data bits, which simplifies the design of memory array 120. However, two CSLs can be used for additional flexibility.

For a data read operation, two data bits, data (n) and data (n+1), can be provided to two internal data lines 126a and 126b, respectively, within one clock cycle. Similarly, for a data write operation, two data bits from internal data lines 126a and 126b can be written to memory array 120 within one clock cycle. Thus, internal data lines 126a and 126b are shown as bidirectional data lines.

The accessed data bits on internal data lines 126a and 126b are buffered and provided to external input/output (I/O) pins. For DDR operation, the data bits are typically clocked out of the external I/O pins on both rising and falling clock edges. DDR operation enables a substantially higher data transfer rate than for a conventional single data rate (SDR) operation.

As used herein, an "accessed" data bit generally refers to either a data bit retrieved from the memory array during a read operation or a data bit written to the memory array during a write operation. Similarly, a "memory access" refers to either a memory read or a memory write operation.

Figure 2A:
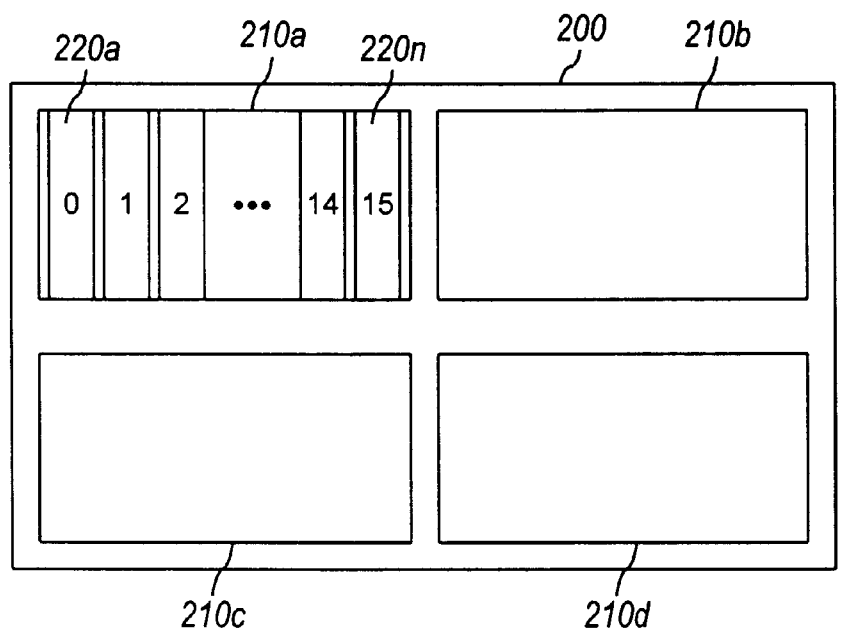
FIGS. 2A and 2B show diagrams of specific embodiments of a memory device and a memory slice, respectively.

FIG. 2A shows a diagram of a specific embodiment of a memory device 200. As shown in FIG. 2A, memory device 200 includes, for example, four memory array blocks 210a through 210d. Each memory array block 210 includes, for example, sixteen memory arrays 220a through 220n. Generally, a memory device can include greater or fewer number of memory array blocks, and each memory array block can include greater or fewer number of memory arrays than that shown in FIG. 2A. As an example, memory device 200 can be a 64-Mbit DRAM device having four memory array blocks 210, with each memory array block 210 including sixteen memory arrays 220, whereby each memory array block 210 includes 16 Mbits of memory and each memory array 220 includes 1 Mbits of memory. As another example, memory device 200 can be a 256-Mbit DRAM device having eight memory array blocks 210, with each memory array block 210 including sixteen memory arrays 220, whereby each memory array block 210 includes 32 Mbits of memory and each memory array 220 includes 2 Mbits of memory.

Figure 2B:
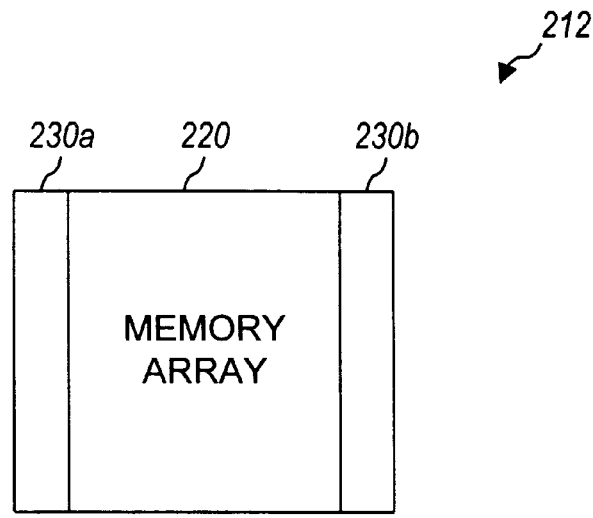

FIG. 2B shows a diagram of a specific embodiment of a memory "slice" 212. Memory slice 212 includes memory array 220 and associated sense amplifier arrays 230a and 230b that are used to provide access to memory array 220. Each sense amplifier array 230 can be used to couple data bits to a corresponding device I/O pin (which is also referred to as a DQ pin). For example, sense amplifier array 230a can couple data bits to DQ(0) and sense amplifier array 230b can couple data bits to DQ(1). Referring back to FIG. 2A, each sense amplifier array 230 may be shared between two adjacent memory arrays 220 of the same memory array block 210.

Figure 2C:
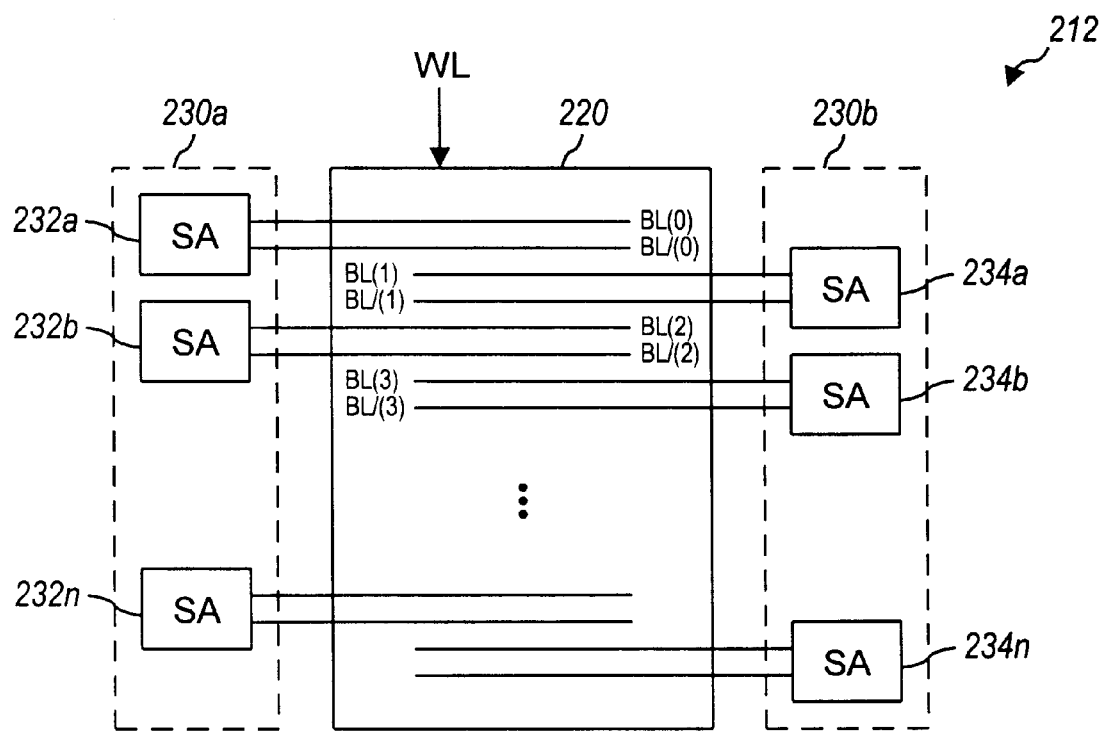
FIG. 2C shows a more detailed diagram of the memory slice.

FIG. 2C shows a more detailed diagram of memory array 220 and sense amplifier arrays 230a and 230b. Sense amplifier array 230a includes a number of sense amplifiers (SA) 232a through 232n, one amplifier 232 for each even numbered bit line (BL). Similarly, sense amplifier array 230b includes a number of sense amplifiers 234a through 234n, one amplifier 234 for each odd numbered bit line. Each bit line is composed of a complementary line pair (e.g., BL(0) and BL/(0)). However, for simplicity, a complementary line pair (e.g., for a bit line, a local I/O line, or a global I/O line) is generically referred to as a "line" in this specification.

To increase the number of data bits that can be stored in a memory array, the spacing between the complementary bit line pair, and between adjacent bit lines, is reduced to very fine line spacing. The fine line spacing can render it impractical to implement the sense amplifiers on only one side of the memory array. Consequently, the sense amplifiers may be distributed on both sides of the memory array. In one implementation, the sense amplifiers are alternated on both sides of the memory array such that the sense amplifiers for the odd numbered bit lines are located on one side of the memory array and the sense amplifiers for the even numbered bit lines are located on the other side. This configuration effectively doubles the available area to implement each sense amplifier. To reduce the number of required sense amplifiers, the amplifiers can be shared by adjacent memory arrays, provided the appropriate control circuits and control signals are made available.

Memory array 220 includes memory cells for many data bits. The memory cells are typically arranged in a two-dimensional array. A word line control signal (WL) selects a particular row within memory array 220, and a column select line (CSL) (not shown in FIG. 2C) selects a particular column. Typically, one CSL is provided for one or more bit lines (BL). The word line and CSL are activated in accordance with a memory address provided by a source external or internal to memory device 200.

Figure 3:
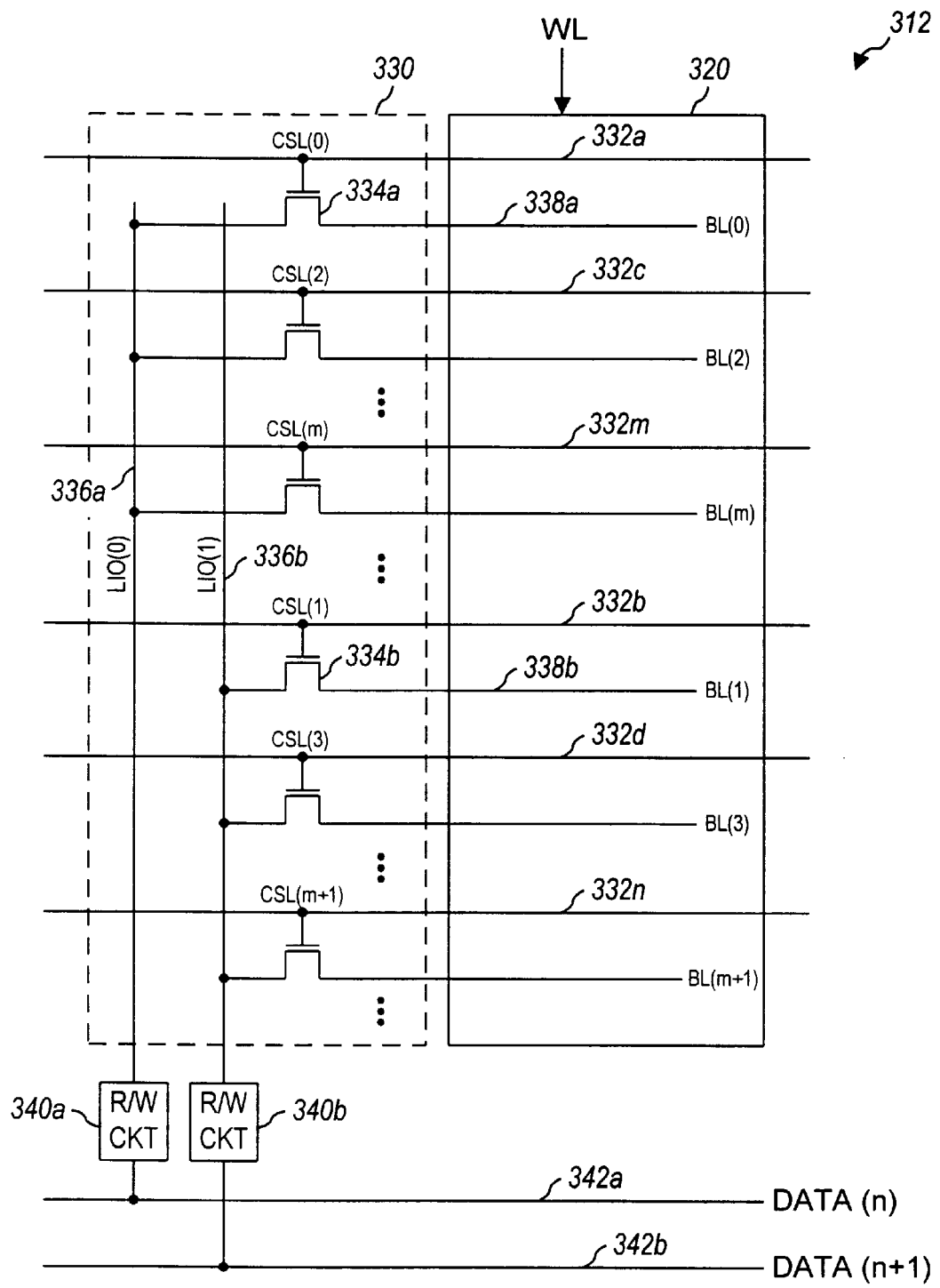
FIG. 3 shows a schematic diagram of a memory array architecture that supports DDR operation.

FIG. 3 shows a schematic diagram of a memory array architecture that supports DDR operation. A memory slice 312 includes a memory array 320 and a sense amplifier array 330. A plurality of CSLs 332 traverse through memory array 320 and sense amplifier array 330. Each CSL 332 couples to the gate of an N-channel transistor 334. The source of transistor 334 couples to a local I/O line (LIO) 336 and the drain of transistor 334 couples to a bit line (BL) 338. Each local I/O line 336 is composed of a complementary line pair. For clarity, the complementary lines (e.g., for local I/O line 336 and bit line 338) and their associated N-channel transistors are not shown in FIG. 3. As shown in FIG. 3, local I/O line 336a couples to transistors 334 in the upper half of memory slice 312, and local I/O line 336b couples to transistors 334 in the lower half.

Local 110 lines 336a and 336b further couple to data read/write circuits (R/W CKTs) 340a and 340b, respectively. Each data R/W circuit 340 includes a secondary sense amplifier that detects the voltage on local I/O line 336 during a read operation, and a data driver that drives local I/O line 336 during a write operation. Data RJW circuit 340 is well known in the art and not described in detail herein. The outputs from data R/W circuits 340a and 340b are provide to internal data lines 342a and 342b, respectively.

In FIG. 3, local I/O lines 336a and 336b are each shown as a single local I/O line. However, local I/O lines 336a and 336b can each represent a set of M local I/O lines that allows for concurrent access of M data bits during a memory read or write operation. For example, each of local I/O lines 336a and 336b can be implemented as a set of four local I/O lines, thereby allowing concurrent access of four data bits on each set of local I/O lines.

The architecture shown in FIG. 3 allows concurrent access of two data bits from the memory array. However, these two data bits are provided by the use of two sets of local I/O lines, or twice the number of local I/O lines of a conventional memory architecture that support single data rate (SDR) operation. The additional local I/O lines increase the required die area of the memory slice. Referring back to FIG. 2A, each memory array block 210 within memory device 200 includes a number of memory arrays 220. For the architecture shown in FIG. 3, one additional set of local I/O lines is used to support DDR operation for each memory array 220. The cumulative additional local I/O lines for all memory arrays 220 can result in a significant increase in die areas of memory device 200.

For clarity, FIG. 3 shows circuitry for one device I/O pin (e.g., one DQ pin). Thus, memory slice 312 contains approximately half the circuitry of memory slice 212 of FIG. 2C. The bit lines in FIG. 3 are renumbered from the bit lines in FIG. 2C, again for clarity.

Figure 4:
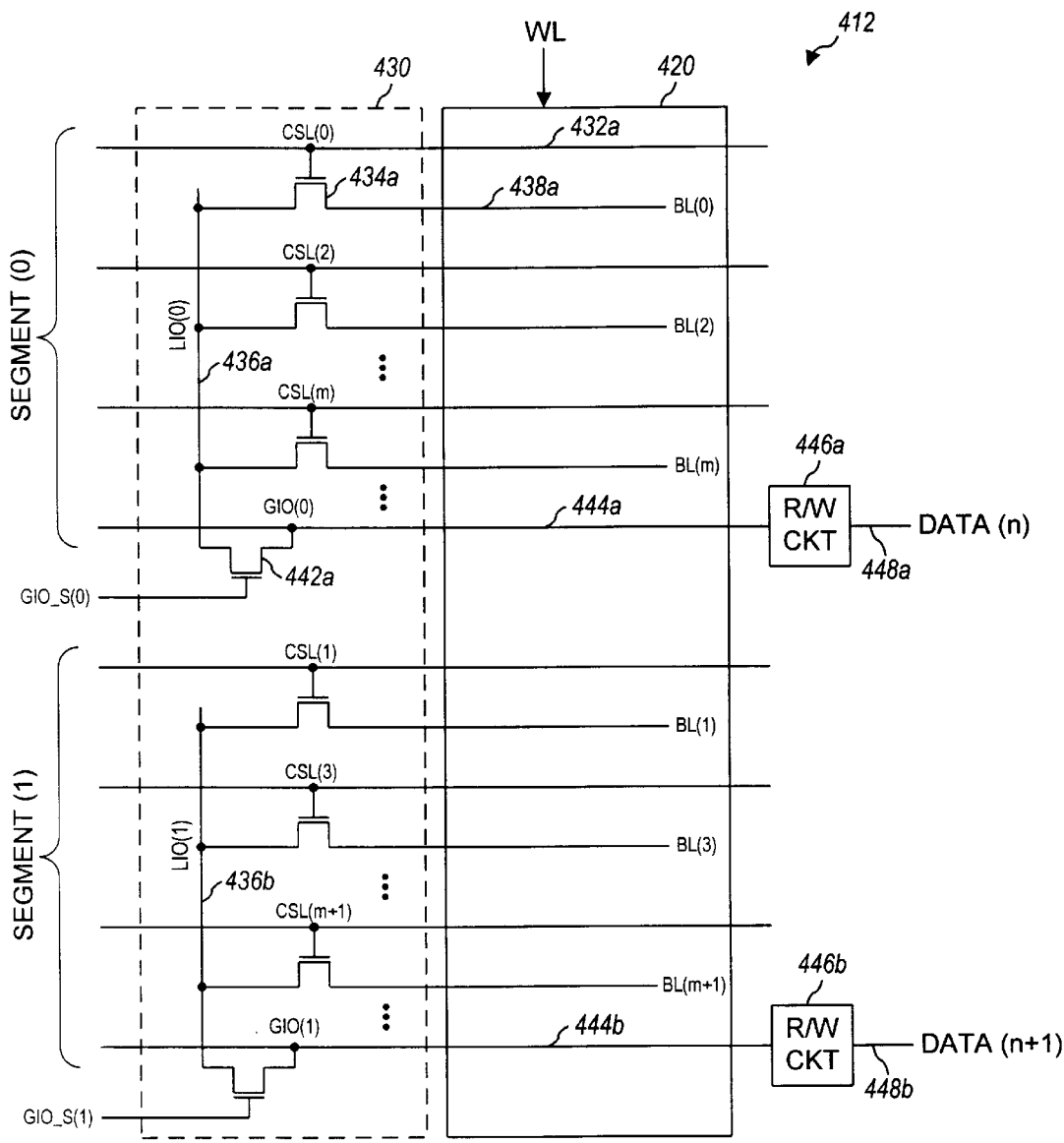
FIG. 4 shows a schematic diagram of a segmented memory array architecture that supports DDR operation.

FIG. 4 shows a schematic diagram of a segmented memory array architecture that supports DDR operation. A memory slice 412 includes a memory array 420 and a sense amplifier array 430, similar to memory slice 312 in FIG. 3. However, memory slice 412 is partitioned into segments.

Within each segment, a number of CSLs 432 traverses through memory array 420 and sense amplifier array 430. Each CSL 432 couples to the gate of an N-channel transistor 434. The source of transistor 434 couples to a local I/O line (LIO) 436 and the drain of transistor 334 couples to a bit line (BL) 438. As with FIG. 3, the complementary bit lines and their associated N-channel transistors are not shown in FIG. 4 for clarity.

Local I/O line 436a couples to transistors 434 within segment (0) in the upper half of memory slice 410, and local I/O line 436b couples to transistors 434 within segment (1) in the lower half. However, unlike the local I/O lines in FIG. 3 that traverse the entire length of the memory array, local I/O lines 436a and 436b traverse only a portion of (e.g., approximately half) the length of memory array 420.

Local I/O line 436 further couples to the source of an N-channel transistor 442. The gate of transistor 442 couples to a global I/O control signal (GIO_S) and the drain of transistor 442 couples to a global I/O line (GIO) 444. Transistor 442 behaves as a pass transistor that couples the selected local I/O line 436 (as determined by the control signal GIO_S) to an associated global IO line 444. Each global I/O line 444 is composed of a complementary line pair, but the complementary lines are not shown for clarity.

Global I/O lines 444a and 444b couple to respective data R/W circuits (R/W CKTs) 446a and 446b. Each data R/W circuit 446 includes a secondary sense amplifier that detects the voltage on local I/O line 436 during a read operation, and a data driver that drives local I/O line 436 and global I/O line 444 during a write operation. Again, data R/W circuit 446 is known in the art and not described in detail herein. The output of data R/W circuits 446a and 446b couple to internal data lines 448a and 448b, respectively. Data R/W circuit 446a and 446b can provide two data bits within one clock cycle. Data R/W circuit 446 can be used for one or more memory arrays 420, or for all memory arrays within a memory array block. Generally, one data RIW circuit 446 is provided for all memory arrays 420 sharing a common global I/O line 444.

In one aspect of the invention, the columns (i.e., the bit lines) of memory array 420 are designated to respective segments in a manner such that two columns within the same segment are not concurrently accessed. This arrangement allows for concurrent access of two data bits from two segments through two local I/O lines 436.

In another aspect of the invention, two data bits can be accessed from two different memory addresses within one clock cycle. The memory addresses can be provided by a source external to the memory device, or by an address generator within the memory device. In one implementation, one of the memory addresses is specified (i.e., either by an external or an internal source) and the other memory address is determined based on the specified memory address. For example, the first memory address can be specified as n, and the second memory address can be determined as n+1, n−1, or based on some other relationships.

In the embodiment shown in FIG. 4, segment (0) includes even numbered bit lines and segment (1) includes odd numbered bit lines. This configuration allows concurrent access of a pair of odd numbered and even numbered data bits (e.g., data (n) and data (n+1)). However, the bit lines can be arranged in other ways, and these various arrangements are within the scope of the invention.

In FIG. 4, local I/O lines 436a and 436b are each shown as a single local I/O line. However, local I/O lines 436a and 436b can each represent a set of M local I/O lines that allows concurrent access of up to M data bits during a memory read or write operation. For example, each of local I/O lines 436a and 436b can be implemented as a set of four local I/O lines to allow concurrent access of four data bits from a memory segment.

For clarity, FIG. 4 (as with FIG. 3) shows circuitry for one device I/O pin (e.g., one DQ pin). Thus, memory slice 412 contains approximately half the circuitry of memory slice 212 of FIG. 2C.

The architecture shown in FIG. 4 allows concurrent access of two data bits from memory array 420. These two bits are provided by two local I/O lines 436a and 436b. However, the combined length of local I/O lines 436a and 436b is approximately equal to that of a conventional SDR memory architecture. For example, each local I/O line 436 is approximately half the length of a conventional local I/O line. Implementation of local I/O lines 436a and 436b thus requires minimal additional die area than that of a conventional memory array. The architecture shown in FIG. 4 supports DDR operation with essentially "no penalty" in die area.

Another aspect of the invention is the arrangement of local I/O lines 436 and global I/O lines 444. As shown in FIG. 4, local I/O lines 436 are arranged in substantially the same orientation as local I/O lines 336 in FIG. 3. The data bits on local I/O lines 436 are provided to internal data lines 448 through global I/O lines 444. Global I/O lines 444 can be efficiently implemented similar to CSLs 432. Similarly, the control signals (GIO_S) can be efficiently implemented with minimal additional die area.

Figure 5:
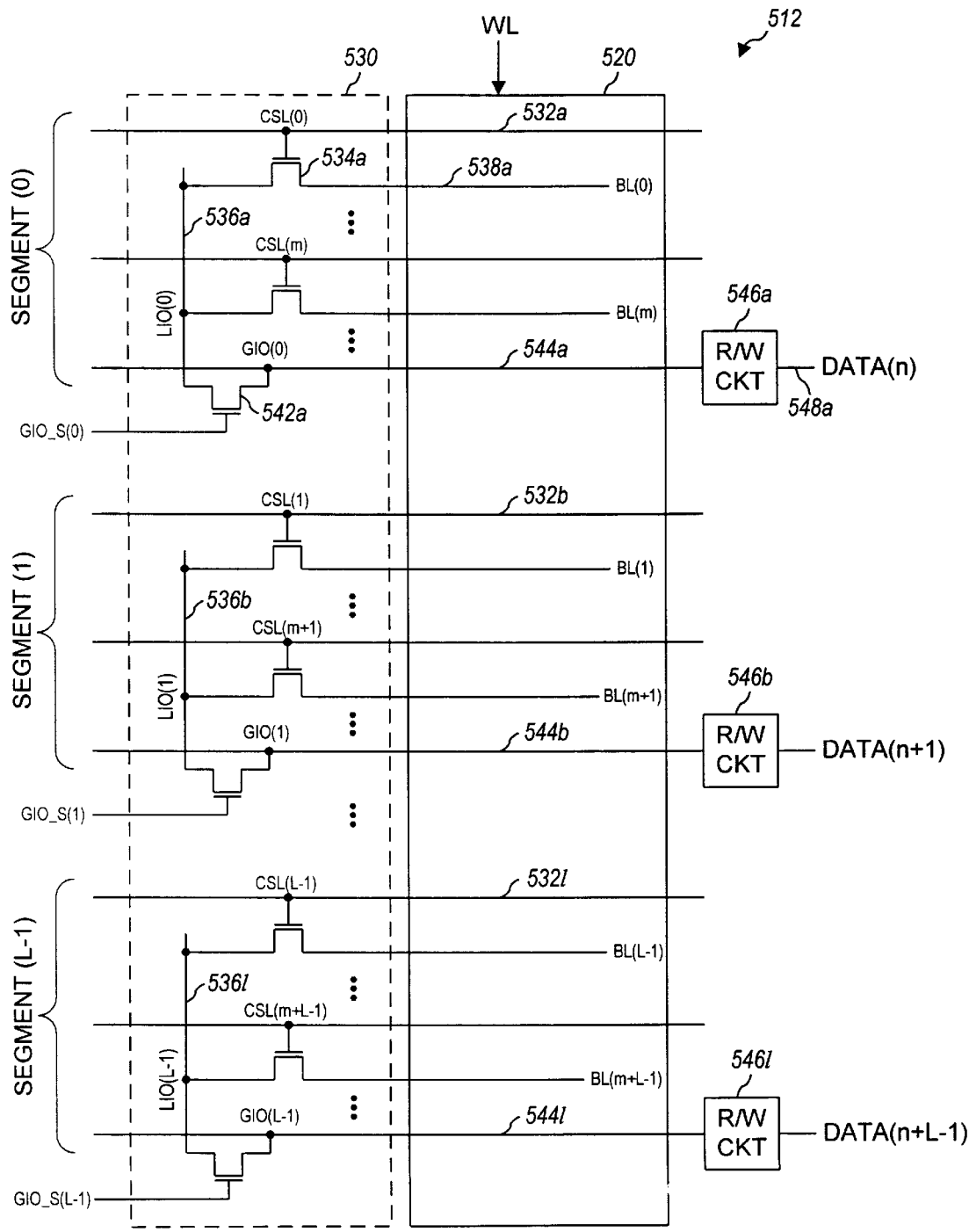
FIG. 5 shows a schematic diagram of a segmented memory array architecture that supports multi-data rate operation.

FIG. 5 shows a schematic diagram of a segmented memory array architecture that supports multi-data rate operation. A memory slice 512 is a further extension of memory slice 412 of FIG. 4. Memory slice 512 includes a memory array 520 and a sense amplifier array 530, similar to memory slice 412 in FIG. 4. However, memory slice 512 is partitioned into L segments, labeled as segment (0) through segment (L−1).

Each segment of memory slice 512 is similar to that of memory slice 412. In particular, within each segment, a number of CSLs 532 traverses through memory array 520 and sense amplifier array 530. Each CSL 532 couples to the gate of an N-channel transistor 534. The source of transistor 534 couples to a local I/O line (LIO) 536 and the drain of transistor 534 couples to a bit line (BL) 538. Local I/O line 536 further couples to the source of an N-channel transistor 542. The gate of transistor 542 couples to a global I/O control signal (GIO_S) and the drain of transistor 542 couples to a global I/O line (GIO) 544. Transistor 542 behaves as a pass transistor and couples the selected local I/O line 536 (as determined by the control signal GIO_S) to an associated global I/O line 544. Each global I/O line 544 couples to a respective data R/W circuit 546. The output of data R/W circuits (R/W CKTs) 546 couple to respective internal data lines 548.

In the embodiment shown in FIG. 5, segment (0) includes every L-th bit line (e.g., bit lines BL(0), BL(L), BL(2L), and so on). Similarly, the remaining segments each includes a different set of bit lines that are spaced L bits apart. This configuration allows for concurrent access of L data bits from L segments on L local I/O lines. The bit lines can be arranged in other ways, and these various arrangements are within the scope of the invention.

Similar to memory slice 412 in FIG. 4, local I/O lines 536a through 5361 can each represent a set of M local I/O lines that allows concurrent access of up to M data bits during a memory read or write operation. For example, each of local I/O lines 536 can be implemented as a set of four local IPO lines to allow concurrent access of four data bits from a memory segment.

Similar to that described above, the columns (i.e., the bit lines) of memory array 520 can be designated to respective segments in a manner such that only one column within each segment is accessed at any given moment. This allows L data bits to be concurrently accessed from L segments through L respective local I/O lines within one clock cycle.

In one implementation, one of the memory addresses is specified and the remaining memory addresses are determined based on the specified memory address. For example, the first memory address can be specified as n, and the remaining memory address can be determined as n+1, n+2, through n+L−1. As another example, the first memory address can be specified as n, and the remaining memory addresses can be determined as n−1, n−2, through n−L+1. Other relationships can be used to determine the unspecified memory addresses and are within the scope of the invention.

Although some embodiments of the invention described above are specifically directed toward double data rate operation, the general inventive concept can be extended to concurrent memory access of any number of data bits. For example, the architectures shown above can easily be modified for a quadruple data rate operation, an octal data rate operation, or a P data rate operation (where P is any integer greater than one).

The memory arrays described herein can be implemented within a standalone integrated circuit (IC) such as, for example, a DRAM IC. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A memory device comprising:

at least one memory array, each memory array including a plurality of memory cells and partitioned into a plurality of segments, each segment associated with at least one local I/O line, each local I/O line having a length that is a portion of a length of one memory array, and wherein N local I/O lines associated with N segments are operative to concurrently provide N data bits to N memory cells in a multi-data rate write operation, or to concurrently receive N data bits from N memory cells in a multi-data rate read operation, where N is two or more.

2. The device of claim 1, further comprising:

a plurality of global I/O lines, at least one global I/O line for each of the plurality of segments in a memory array, each global I/O line operatively coupled to one or more local I/O lines associated with one or more segments of one or more memory arrays.

3. The device of claim 2, further comprising:

at least one pass transistor for each segment of each memory array, each pass transistor coupling one local I/O line to one associated global I/O line.

4. The device of claim 1, wherein each local I/O line associated with a particular segment couples to a set of bit lines associated with the particular segment.

5. The device of claim 1, wherein each segment is associated with one local I/O line.

6. The device of claim 1, wherein the at least one local I/O line associated with each segment has substantially equal length, and wherein a combined length of one local I/O line from the plurality of segments in each memory array is approximately equal to the length of the memory array.

7. The device of claim 1 wherein each memory array is partitioned into two substantially similar segments.

8. The device of claim 7 wherein each segment includes one local I/O line, the local I/O line of a first segment couples to even numbered bit lines and the local I/O line of a second segment couples to odd numbered bit lines.

9. The device of claim 8 wherein memory cells having consecutively numbered addresses are concurrently accessed.

10. The device of claim 1 wherein each memory array is partitioned into L substantially similar segments.

11. The device of claim 10, wherein each of the L segments is associated with one local I/O line that operatively couples to a set of bit lines associated with the segment.

12. The device of claim 11 wherein the bit lines associated with each segment are spaced L bits apart.

13. The device of claim 1 wherein each memory array is further associated with at least one sense amplifier array.

14. The device of claim 13 wherein each memory array is associated with two sense amplifier arrays, one sense amplifier array located on each side of the memory array, each sense amplifier array couples to alternate bit lines within the memory array.

15. The device of claim 1 as implemented within a dynamic random access memory (DRAM) device.

16. The device of claim 1 as implemented within an integrated circuit having an embedded memory array.

17. A memory device comprising:

a plurality of memory array blocks, each memory array block including a plurality of memory arrays and associated with at least one sense amplifier array, each memory array including a plurality of memory cells and partitioned into L substantially similar segments, each segment associated with at least one local I/O line, each local I/O line having a length that is approximately 1/L of a length of the memory array, and wherein N local I/O lines associated with N segments are operative to concurrently provide N data bits to N memory cells in a multi-data rate write operation, or to concurrently receive N data bits from N memory cells in a multi-data rate read operation, where N is two or more.

18. The memory device of claim 17 as implemented within a dynamic random access memory (DRAM) device.

19. The memory device of claim 17 as implemented within a synchronous graphics random access memory (SGRAM).

20. The memory device of claim 17 wherein the memory device includes at least 256 million bits (Mbits) of memory.

21. The memory device of claim 17 wherein the memory device supports double data read (DDR) operation.

22. A memory device comprising:

at least one memory array and at least one sense amplifier array, each memory array including a plurality of memory cells and partitioned into a plurality of substantially similar segments, each segment associated with at least one local I/O line, each local I/O line having a length that is a portion of a length of the memory array, each local I/O line operatively coupled to a plurality of bit lines and further to a respective global I/O line, and wherein N local I/O lines associated with N segments are operative to concurrently provide N data bits to N memory cells in a multi-data rate write operation, or to concurrently receive N data bits from N memory cells in a multi-data rate read operation, where N is two or more.

23. A memory device comprising:

at least one memory array of memory cells and a plurality of local I/O lines, each local I/O line operably coupled to an associated subset of bit lines within one memory array and to an associated internal data line, and wherein N local I/O lines are operative to concurrently provide N data bits to N memory cells in a multi-data rate write operation, or to concurrently receive N data bits from N memory cells in a multi-data rate read operation, where N is two or more.

24. The device of claim 23 wherein each memory array is associated with two local I/O lines, a first local I/O lines operably couples to odd numbered but lines and a second local I/O line couples to even numbered bit lines.

25. The device of claim 24, wherein memory cells having consecutively numbered addresses are concurrently accessed.

26. The memory device of claim 23 as implemented within a dynamic random access memory (DRAM) device.

27. The memory device of claim 23 as implemented within a synchronous graphics random access memory (SGRAM).

28. The device of claim 23 as implemented within an integrated circuit having an embedded memory array.

* * * * *